United States Patent [19]

Lee

[11] Patent Number: 5,557,240
[45] Date of Patent: Sep. 17, 1996

[54] POWER SUPPLY FOR A COMPUTER INCLUDING A SOUND SIGNAL AMPLIFYING CIRCUIT

[75] Inventor: Jang-Bin Lee, Uijongbu, Rep. of Korea

[73] Assignee: Korson Co., Ltd., Rep. of Korea

[21] Appl. No.: 444,433

[22] Filed: May 19, 1995

[30] Foreign Application Priority Data

Oct. 10, 1994 [KR]  Rep. of Korea ............... 94-26398

[51] Int. Cl.$^6$ ................................................ H03F 3/04
[52] U.S. Cl. .................................... 330/297; 381/120
[58] Field of Search ............................ 323/265, 266; 330/251, 285, 297; 381/120

[56] References Cited

U.S. PATENT DOCUMENTS 5,151,907  9/1992  Robbins .................................. 371/66
5,357,214  10/1994  Heyl et al. ........................... 330/297

Primary Examiner—Steven Mottola
Attorney, Agent, or Firm—Ladas & Parry

[57] ABSTRACT

A power supply for a computer capable of additionally generating a high power Hi-Fi sound by including a sound signal amplifying circuit is disclosed. The power supply reduces the cost of manufacture and efficiently utilizes the cabinet space of a computer while efficiently providing a high power sound signal for use in a multimedia computer, by incorporating a first rectifying means for rectifying AC power to DC power, a voltage control means for generating a high frequency pulse, a voltage transforming means for transforming the voltage, a second rectifying means for operating the computer, a third rectifying means for operating a sound signal amplifier, and an amplifying means for amplifying the sound signal, and an amplification level adjusting means for adjusting the sound quality of the amplifying means.

5 Claims, 6 Drawing Sheets

POWER SUPPLY FOR A COMPUTER INCLUDING A SOUND SIGNAL AMPLIFYING CIRCUIT

BACKGROUND OF INVENTION

1. Field of the Invention

The present invention relates to a power supply for a computer, and more particularly to a power supply for a computer which further includes a high power amplifier with a sound signal amplifying circuit.

2. Information Disclosure Statement

In general, a prior art power supply for a computer receives alternating current having a voltage of 110 V or 220 V and supplies electrical power to operate the mother board, hard disk driver, floppy disk driver, compact disc driver, or the like, of a computer. The power supply converts the alternating current into direct current and supplies it to each computer component. However, due to the emergence of multi-media, a computer system presently processes an audio or video signal by adding a speaker or other needed apparatuses outside of the computer system.

In general, in case of processing an audio signal by connecting a speaker to the computer system, the prior art ±12 V power supply cannot supply sufficient power which can operate an external speaker having an output equal to or greater than 5 W. That is, the power source for operating the computer is limited and cannot operate an amplifier for a speaker connected to the computer.

In addition, the prior art computer provides a sound signal to an amplifying speaker connected to the outside of the computer which amplifies the sound signal by using an additional and separate power supply from the computer power supply. Therefore, the prior art power supply for use in a computer has problems in that it cannot supply power which can produce a high power Hi-Fi sound so that users are unable to hear high power Hi-Fi sound. Further, the interior space of a computer cabinet is not efficiently used because the power supply of the computer and the amplifier to amplify the sound signal are separated from each other therefore increasing the cost of manufacture.

An object of the present invention is to provide a computer power supply for powering computer components and which includes an integral powered reduced-noise-level amplifier for powering external speakers.

Another object of the present invention is to provide a high sound performance multi-media computer system capable of powering a power supply integrated amplifier suitable for driving noise reduced sound external speakers.

The preceding objects should be construed as only presenting a few of the more pertinent features and applications of the invention. Many other beneficial results can be obtained by applying the disclosed invention in a different manner or modifying the invention within the scope of the disclosure. Accordingly, other objects and a fuller understanding of the invention may be had by referring to both the Summary of the Invention and the Detailed Description, below, which describe the preferred embodiment in addition to the scope of the invention defined by the claims considered in conjunction with the accompanying drawings.

SUMMARY OF THE INVENTION

The computer power supply having a sound signal amplifying circuit of the present invention is defined by the claims with a specific embodiment shown in the attached drawings.

The present invention is invented to solve the above described problems. The purpose of the present invention is to provide a power supply having a high power sound signal amplifying circuit which is not complicated and which can be efficiently made by integrating a power supply of computer and a sound signal amplifier by adding a power supply for operating a sound signal amplifier to the prior art computer power supply to thereby combine the sound signal amplifier and the power supply of computer.

For the purpose of summarizing the invention, the invention relates to a power supply with an integrated sound signal amplifying circuit for use with a computer. The power supply system according to the present invention comprises a first rectifying means 31 for receiving AC power from an AC power source, rectifying the AC power to DC power and outputting the DC power. A voltage control means 32 receives the DC power and generates a voltage having a high frequency pulse by Switching Mode method and outputs the high frequency pulse voltage. A voltage transforming means 33 receives and transforms the high frequency pulse voltage to a high frequency pulse voltage which is suitable for the operation of computer components and to a high frequency pulse voltage which is suitable for the amplification of a sound signal. A second rectifying means 34 receives the high frequency pulse voltage suitable for operation of computer components and rectifies the high frequency pulse voltage thereby providing a stabilized high frequency pulse voltage suitable for powering the computer components. A third rectifying means 35 receives the high frequency pulse voltage suitable for amplification of a sound signal and rectifies the high frequency pulse voltage suitable for amplification of a sound signal to a stabilized and noise free voltage for the amplification of sound signals, and outputs the stabilized and noise free voltage. An amplifying means 36,37 receives the stabilized and noise free voltage from the third rectifying means 35 for amplifying a sound signal to drive an external speaker in use. A voltage stabilizing means 38 receives the stabilized and noise free voltage from the third rectifying means 35 and further rectifies the voltage to a stabilized voltage and outputs the stabilized voltage. An amplification level adjusting means 39 operably receives the stabilized voltage from the voltage stabilizing means 38 to enable the adjustment of the function of the amplifying means 36,37 and the sound quality (headphone, microphone, base, treble, balance, microphone volume, and the like) during the operation of the amplifying means 36 and 37.

The more pertinent and important features of the present invention have been outlined above in order that the detailed description of the invention which follows will be better understood and that the present contribution to the art can be fully appreciated. Additional features of the invention described hereinafter form the subject of the claims of the invention. Those skilled in the art can appreciate that the conception and the specific embodiment disclosed herein may be readily utilized as a basis for modifying or designing other structures for carrying out the same purposes of the present invention. Further, those skilled in the art can realize that such equivalent constructions do not depart from the spirit and scope of the invention as set forth in the claims.

BRIEF DESCRIPTION OF THE DRAWINGS

For fuller understanding of the nature and objects of the invention, reference should be had to the following detailed description taken in conjunction with the accompanying drawings in which:

3

Figure 1:
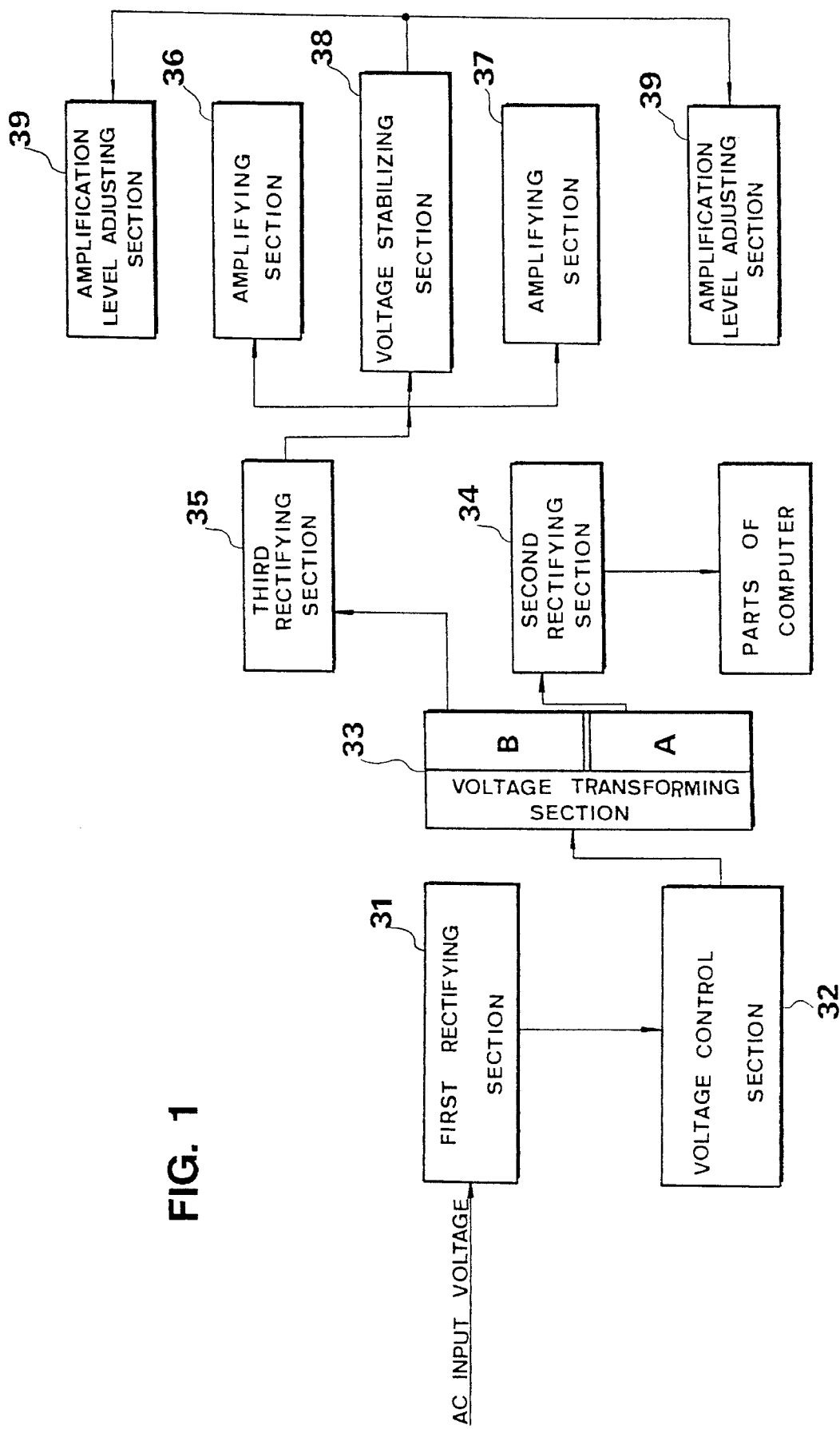
Figure 2A:
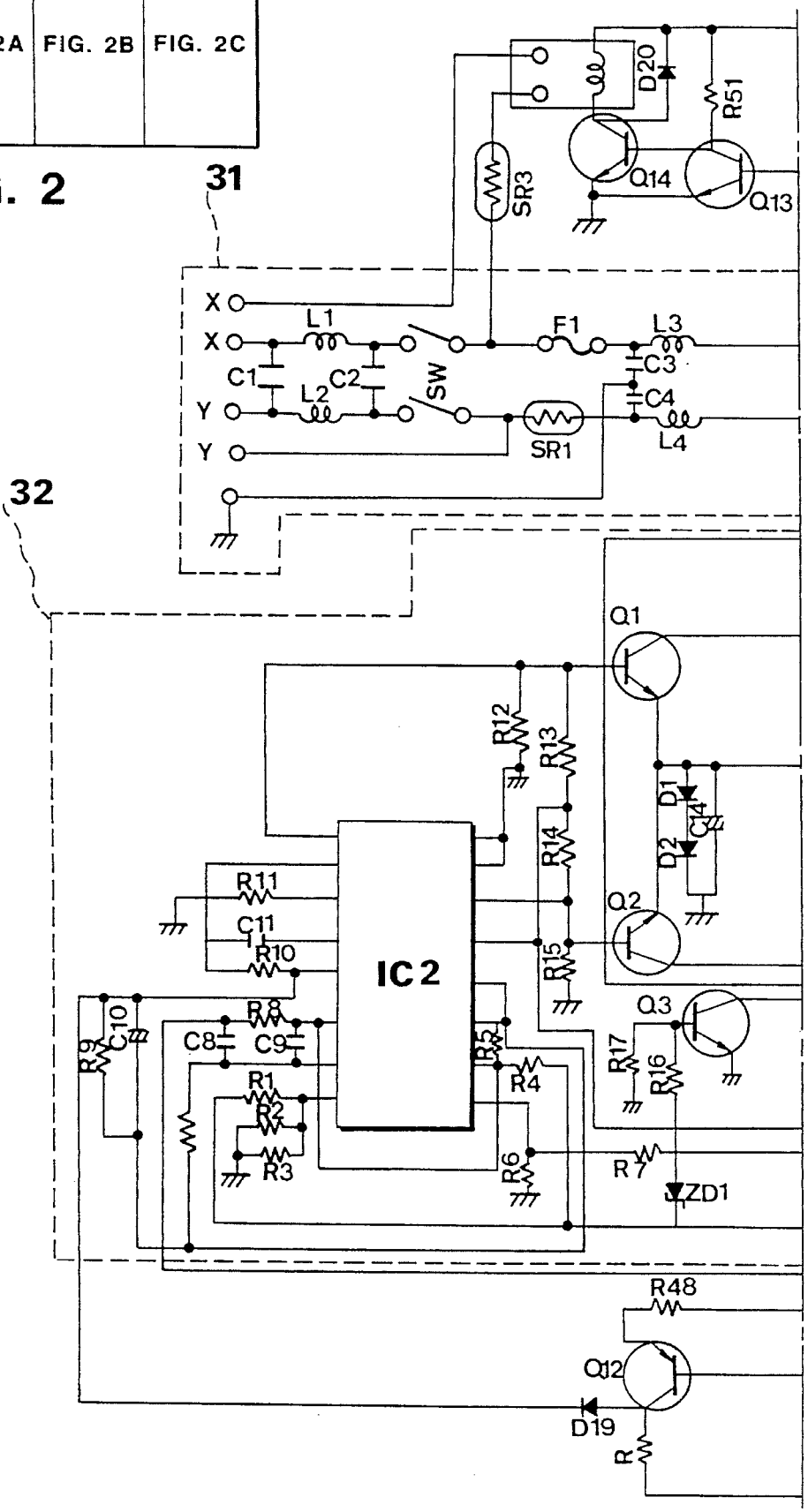
Figure 2B:
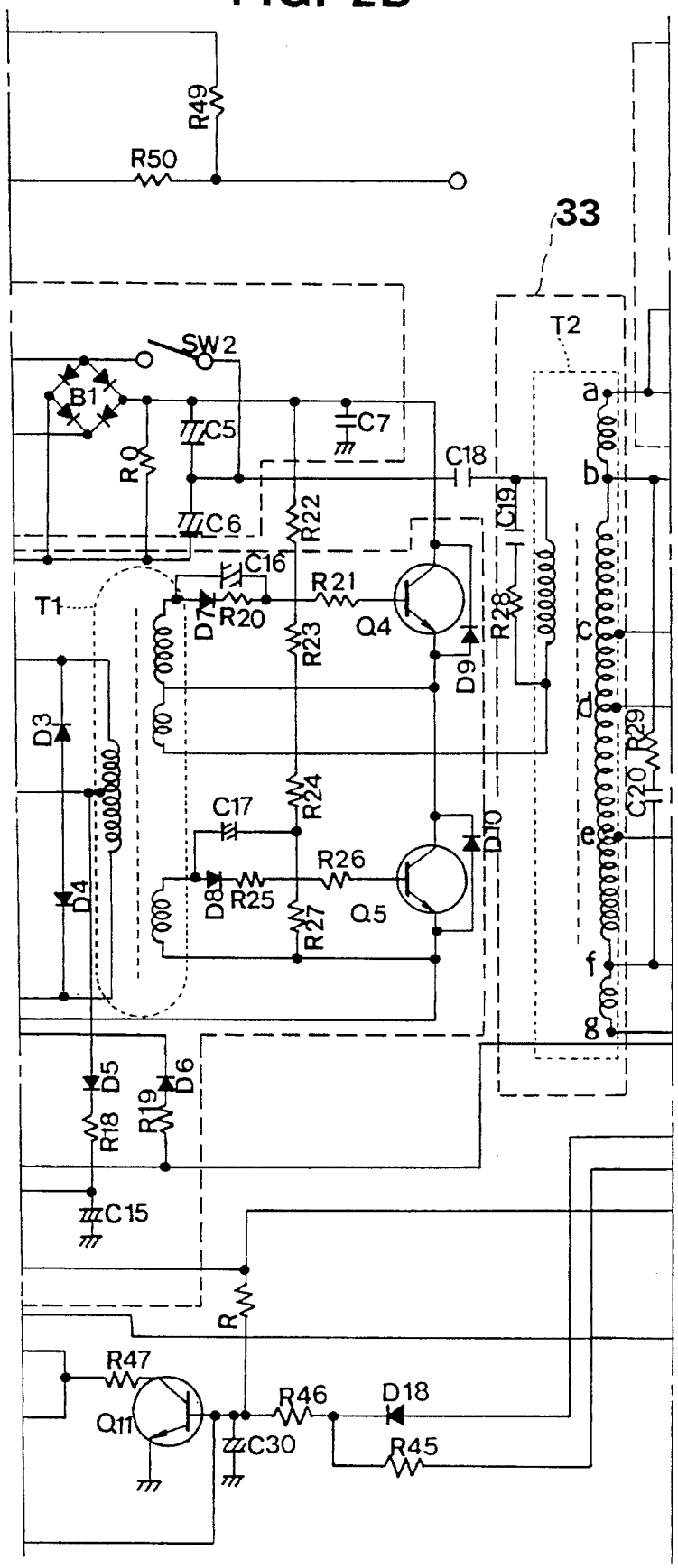
Figure 2C:
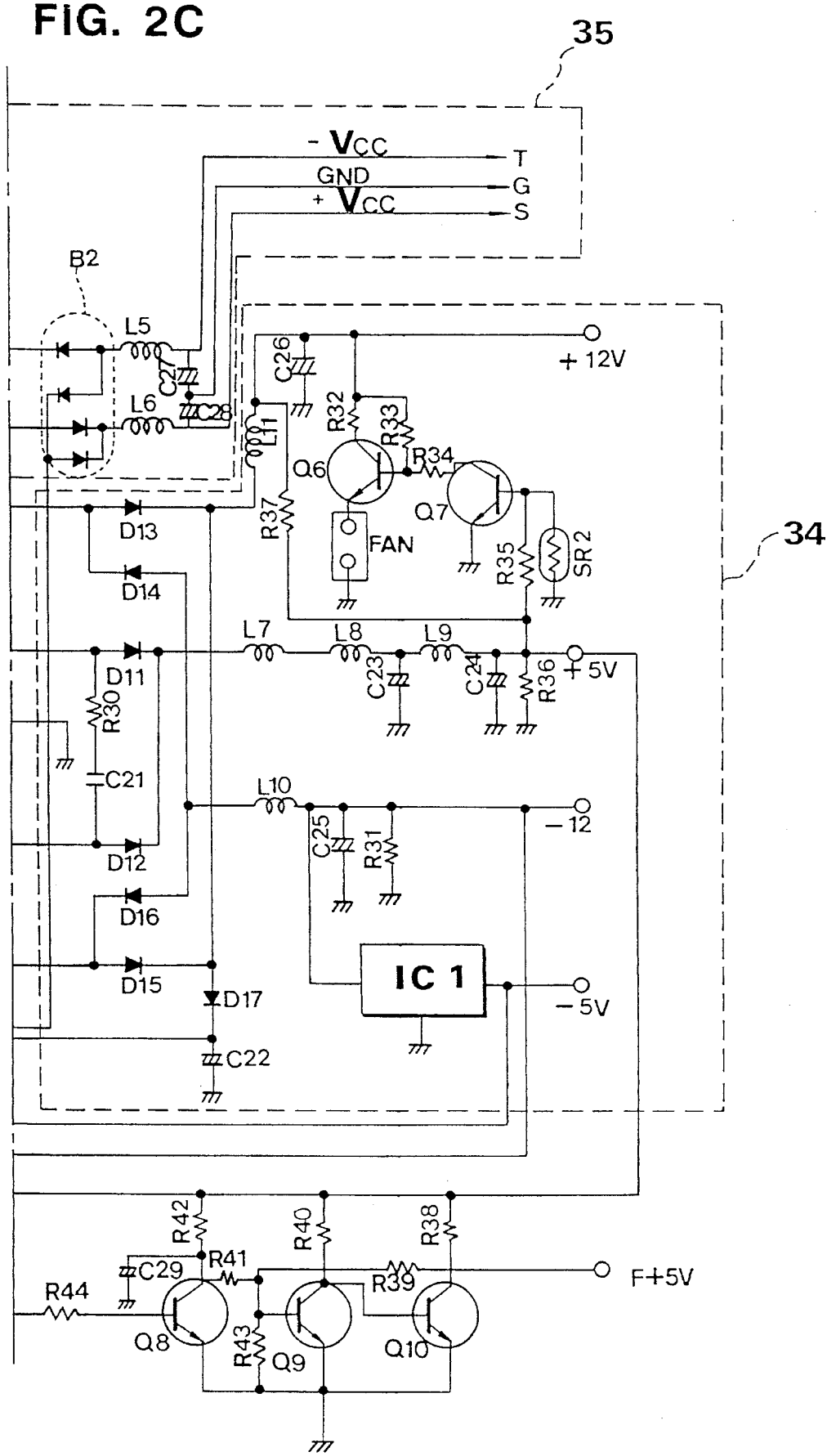
Figure 3A:
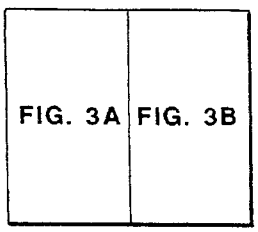
Figure 3A:
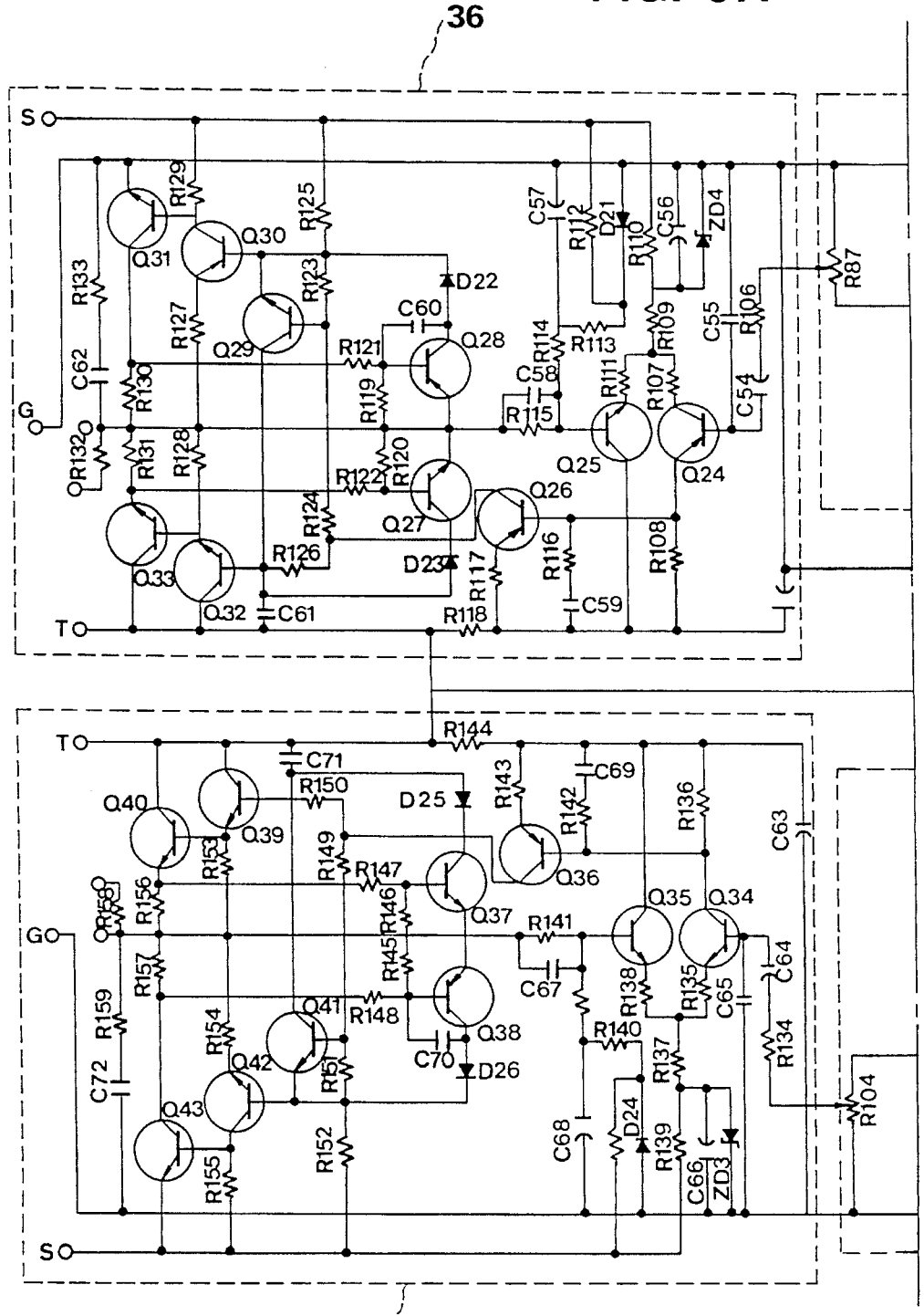
Figure 3B:
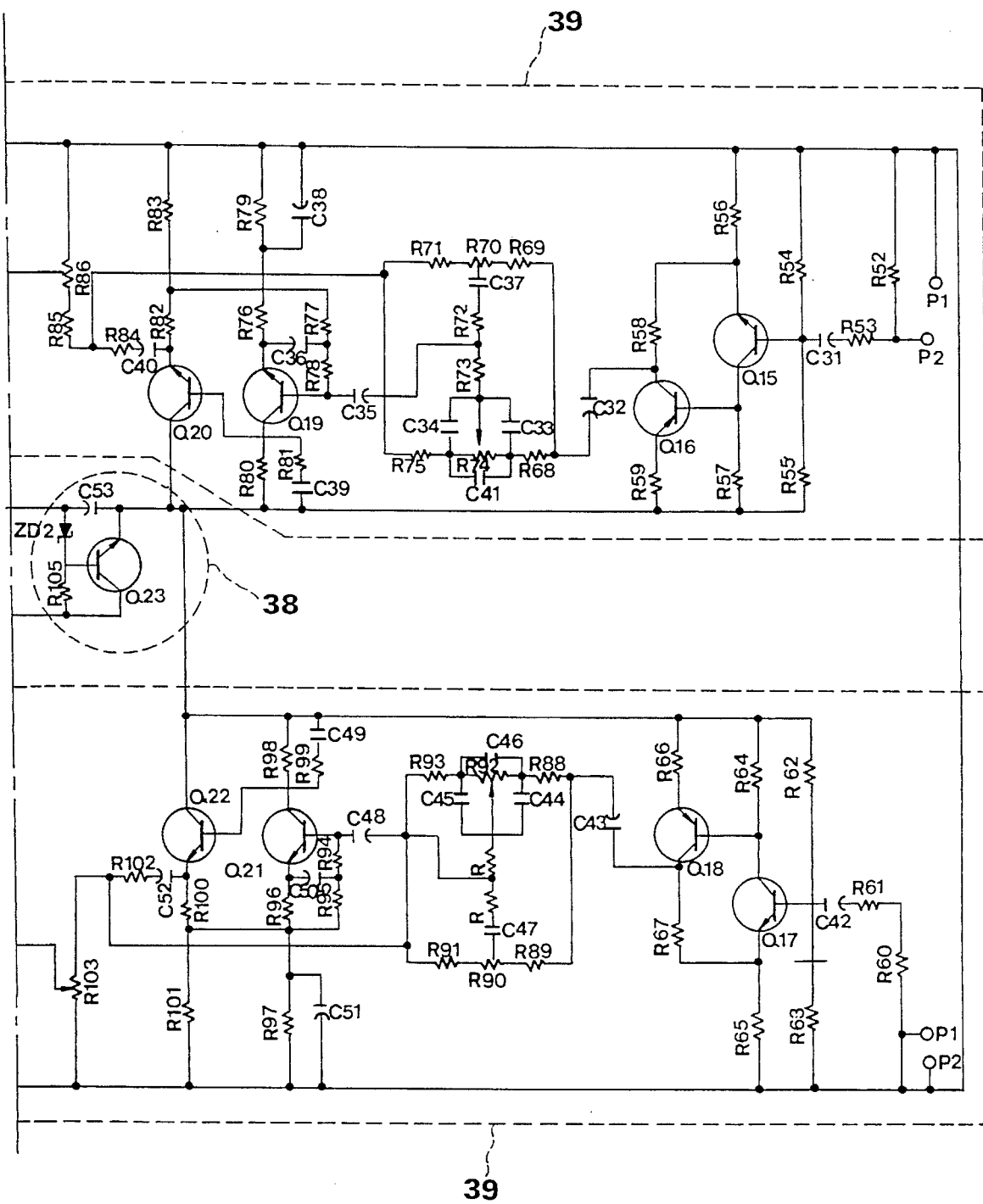

FIG. 1 is a block diagram of the power supply according to the present invention; and FIGS. 2 and 3 are circuit diagrams of the power supply according to the present invention.

Similar reference characters refer to similar parts throughout the several views of the drawings.

DETAILED DESCRIPTION OF THE INVENTION

FIG. 1 is a block diagram of the power supply according to the present invention. The first rectifying means 31 receives AC voltage, rectifies it to DC voltage and supplies the DC voltage to transistors Q4 and Q5 of the voltage control means 32. The voltage control means 32 generates a high frequency pulse by supplying a controlled voltage controlled by the Switching Mode method to bases of the transistors Q4 and Q5.

The second transformer T2 of the voltage transforming means 33 receives the high frequency pulse voltage and transforms the received high frequency pulse voltage to a high frequency pulse voltage [(rectified) voltage "A" is actually two voltages DC ±5 V and ±12 V as appreciated in the art] necessary for the operation of a computer system and to a high frequency pulse voltage [(rectified) voltage "B" is DC ±24 V] necessary for the operation of a sound signal amplifier.

Voltage "A" is supplied to each part of the computer (mother board, hard disk drive, floppy disk drive, compact disc driver, or the like, i.e. the normal non-sound amplifying components) through a second rectifying means 34 which rectifies the high frequency pulse voltage "A" required for the operation of the computer to a stabilized voltage.

The third rectifying means 35 rectifies the high frequency pulse voltage "B" required for the operation of a sound signal amplifier to a stabilized voltage in which noise is removed, and supplies the stabilized voltage to amplifying means 36 and 37, and the amplifying means 36 and 37 amplify a sound signal and transmit the amplified signal to the external speaker which can generate Hi-Fi sound, up to a maximum of 250 watts.

The voltage stabilizing means 38 receives the voltage from the third rectifying means 35, rectifies the voltage to a stabilized voltage and supplies the voltage to an amplification level adjusting means 39, and the amplification level adjusting means 39 adjusts function and sound quality (headphone, microphone, base, treble, balance, microphone volume, etc.) of the operation of the amplifying means 36 and 37.

FIG. 2 is a schematic drawing which illustrates the AC power being supplied to terminals X and Y of the first rectifying means 31 and is passed through reactors L1 and L2 and capacitors C1 and C2, and is further passed through a fuse F1 when switch SW1 is "on", and then rectified by a bridge diode B1, converted to DC voltage by smoothing capacitors C5, C6 and C7, and the DC voltage is supplied to transistors Q4 and Q5 of the voltage control means 32.

The voltage control means 32 controls a switching mode voltage utilizing the Switching Mode method through an integrated circuit IC2 (pulse width control IC) which is operated by +5 V DC voltage output from the second rectifying means 34. The voltage controlled by the integrated circuit IC2 is supplied to a first transformer T1, a drive transformer, through transistors Q1 and Q2. The output from the first transformer T1 is supplied to the bases of the transistors Q4 and Q5 so that the transistors Q4 and Q5 are alternately oscillated ON/OFF to generate a high frequency pulse. Such high frequency pulse voltage is transformed to a desired voltage through the second transformer T2 of the voltage transforming means 33.

In positioning the taps in the secondary windings of the second transformer T2, as shown in FIG. 2, a computer and a sound signal amplifier can be operated if the taps are positioned in such a way that the pulse voltage of +10 V and −10 V is output from a center tap "d" to tap "c" and to tap "e" the pulse voltage of +24 V and −24 V is output from the center tap "d" to tap "b" and to tap "f", and the pulse voltage of more or equal to ±48 V is output from the center tap "d" to tap "a" and to tap "g" by increasing the number of windings. In general, a voltage of about DC ±24 V is required for a speaker to generate a high power Hi-Fi sound.

In the second rectifying means 34, a voltage of DC +5V, obtained by rectifying through diodes D11 and D12 and capacitor C21 a high frequency pulse voltage of ±10V output from a tap "d" to a tap "c" and to a tap "e" of the winding of the second transformer T2, a voltage of DC ±12 V obtained by rectifying through diodes D13 to D16 and capacitors C25 and C26 a high frequency pulse voltage of ±24 V output from tap "d" to tap "b" and to tap "f" of the winding of the second transformer T2, as see FIG. 2. A voltage of DC −5 V output through an integrated circuit IC1 (constant voltage IC) is operatively supplied to the mother board, hard disc driver, floppy disc driver and the compact disc driver of the computer. The rectified voltage of DC +12 V operates a fan through transistor Q6 and resistor R32.

The third rectifying means 35 rectifies a high frequency pulse voltage of ±48 V output at the T2 transformer tap "a" and center tap "d" and the T2 transformer tap "g" and center tap "d" of the second transformer T2 through a bridge diode B2, and supplies a voltage of DC ±24 V stabilized and output through capacitors C27 and C28 and reactors L5 and L6 for noise prevention to terminals T and S of amplifying means 36 and 37 shown in FIG. 3.

As shown in FIG. 3, the amplifying means 36 and 37 and the amplification level adjustment means 39 are known, prior art, circuits. The amplifying means 36 and 37 receives a voltage of DC ±24 V from each terminal T and S and amplifies a sound signal. The voltage stabilizing means 38 receives the voltage supplied to the amplifying means 36 and 37, rectifies the voltage to a stabilized voltage through a Zoner diode ZD2, a resistor R105 and a transistor Q23, and supplies it to the amplification level adjusting means 39. Each terminal P1 and P2 of the amplification level adjusting means 39 receives a low power signal generated by a compact disk or a sound source chip, amplifies the signal through transistor Q15 to Q18 and adjusts the amplification function of the amplifying means 36 and 37 and the sound quality (headphone, microphone, base, treble, balance, microphone volume, etc.) through resistors R87 and R104 and transistors Q19 to Q21.

The power supply of the present invention may be housed in a conventional power supply case. That is, the power supply together with a noise reduced sound signal amplifying circuit according to the present invention does not need a special housing and will fit into the power supply footprint in existing computers.

As described above, the power supply of the present invention can power a computer and a sound signal amplifying circuit and does not require the rearrangement of the computer hardware in the computer case or a separate space, apart from that of the power supply, in the computer case.

The power supply according to the present invention powers the computer components which additionally powers an amplifying circuit removing the need for a separate power supply to operate a Hi-Fi sound signal amplifier in the computer while providing the necessary power for the operation of the external speakers so that a multi-media computer providing the Hi-Fi sound is embodied.

Therefore, the present invention has an advantage in that the cost of manufacturing a multimedia computer system with an added sound function permits easy set-up of a computer audio environment since the power supply and the amplifying circuit are combined.

Although this invention has been described in its preferred form with a certain degree of particularity, it is appreciated by those skilled in the art that the present disclosure of the preferred form has been made only by way of example and that numerous changes in the details of the construction, combination and arrangement of parts may be resorted to without departing from the spirit and scope of the invention.

What is claimed is:

1. A power supply for use with a computer and including a sound signal amplifying circuit, said power supply comprising:

a first rectifying means 31 receiving AC power from an AC power source, rectifying said AC power to DC power and outputting DC power;

a voltage control means 32 receiving said DC power and generating a voltage having a high frequency pulse by Switching Mode method and outputting said high frequency pulse voltage;

a voltage transforming means 33 receiving and transforming said voltage having a high frequency pulse to a voltage having a high frequency pulse suitable for operation of computer components and to a voltage having a high frequency pulse suitable for amplification of a sound signal;

a second rectifying means 34 for receiving said high frequency pulse voltage suitable for operation of computer components and rectifying said high frequency pulse voltage thereby providing a stabilized high frequency pulse voltage suitable for powering said computer components;

a third rectifying means 35 receiving said high frequency pulse voltage suitable for amplification of a sound signal and rectifying said high frequency pulse voltage suitable for amplification of a sound signal to a stabilized and noise free voltage for amplification of sound signals, and outputs said stabilized and noise free voltage; and, an amplifying means 36,37 receiving said stabilized and noise free voltage from said third rectifying means 35 for amplifying a high power sound signal.

2. The power supply of claim 1 further including a voltage stabilizing means 38 receiving said stabilized and noise free voltage from said third rectifying means 35 and further rectifying said voltage to a stabilized voltage and outputting said stabilized voltage; and, an amplification level adjusting means 39 receiving said stabilized voltage from said voltage stabilizing means 38 far adjusting sound quality during operation of said amplifying means 36 and 37.

3. The power supply of claim 1, wherein said high frequency pulse voltage generated by said voltage control means 32 is input to a primary winding of a second transformer T2 of said voltage transforming means 33 such that a secondary winding of said second transformer T2 outputs a DC ±5 V voltage and a DC ±12 V voltage by rectifying high frequency pulse voltages output at tap "b" and to a tap "f" of said secondary winding of said second transformer T2 to power said computer components, and outputting a DC ±24 voltage obtained by rectifying a high frequency pulse voltage output from tap "a" to tap "g" of said secondary winding of said second transformer T2 to power said amplifying means 36,37 which amplifies a high power sound signal.

4. The power supply of claim 1, wherein said voltage transforming means 33 is constructed in such a way that voltages of DC ±5 V and DC ±12 V obtained by rectifying high frequency pulse voltages output from a tap "b" to a tap "f" of a secondary winding after transforming a high frequency pulse voltage which is generated by said voltage control means 32 and supplied to a primary winding of a second transformer T2 drive each part of said computer (mother board, hard disc driver, floppy disc driver, compact disc driver, etc.), and that a voltage of DC ±24 V obtained by rectifying a high frequency pulse voltage output from a tap "a" to tap "g" of said secondary winding drives said amplifying means 36,37 which amplify a high power sound electrical signal.

5. A power supply for use with a computer and including a sound signal amplifying circuit, said power supply comprising:

a first rectifying means 31 receiving AC power from an AC power source, rectifying said AC power to DC power and outputting DC power;

a voltage control means 32 receiving said DC power and generating a voltage having a high frequency pulse by Switching Mode method and outputting said high frequency pulse voltage;

a voltage transforming means 33 receiving and transforming said voltage having a high frequency pulse to a voltage having a high frequency pulse suitable for operation of computer components and to a voltage having a high frequency pulse suitable for amplification of a sound signal;

a second rectifying means 34 for receiving said high frequency pulse voltage suitable for operation of computer components and rectifying said high frequency pulse voltage thereby providing a stabilized high frequency pulse voltage suitable for powering said computer components;

a third rectifying means 35 receiving said high frequency pulse voltage suitable for amplification of a sound signal and rectifying said high frequency pulse voltage suitable for amplification of a sound signal to a stabilized and noise free voltage for amplification of sound signals, and outputs said stabilized and noise free voltage;

an amplifying means 36,37 receiving said stabilized and noise free voltage from said third rectifying means 35 for amplifying a high power sound signal;

a voltage stabilizing means 38 receiving said stabilized and noise free voltage from said third rectifying means 35 and further rectifies said voltage to a stabilized voltage and outputs said stabilized voltage; and, an amplification level adjusting means 39 receiving said stabilized voltage from said voltage stabilizing means 38 permitting adjustment of sound quality during operation of said amplifying means 36 and 37.

* * * * *